(12) United States Patent
Eguchi

(10) Patent No.: US 6,705,450 B2
(45) Date of Patent: Mar. 16, 2004

(54) CLEAN ROOM HAVING AN ESCALATOR, AND METHOD OF TRANSPORTING A SEMICONDUCTOR DEVICE THEREIN

(75) Inventor: Koji Eguchi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 61 days.

(21) Appl. No.: 09/765,428

(22) Filed: Jan. 22, 2001

(65) Prior Publication Data

US 2002/0008005 A1 Jan. 24, 2002

(30) Foreign Application Priority Data

Jul. 19, 2000 (JP) ........................................ 2000-219433

(51) Int. Cl.[7] .............................................. B65G 15/00
(52) U.S. Cl. ...................................................... 198/321
(58) Field of Search ................................ 198/321, 326, 198/333

(56) References Cited

U.S. PATENT DOCUMENTS 3,918,367 A * 11/1975 Alimanestianu et al. .. 198/321 X
5,529,166 A * 6/1996 Markin et al. ....... 198/346.1 X

FOREIGN PATENT DOCUMENTS

| JP | 62-206333 | * | 9/1987 |
| JP | 7-315748 | | 12/1995 |
| JP | 8-169680 | | 7/1996 |
| JP | 2000-249379 | * | 9/2000 |
| JP | 2002-213785 | * | 7/2002 |
| WO | WO 99/46803 | * | 9/1999 |

* cited by examiner

Primary Examiner—James R. Bidwell
(74) Attorney, Agent, or Firm—McDermott, Will & Emery

(57) ABSTRACT

In a clean room having a plurality of floors of different levels, an escalator is disposed between the plurality of floors for transporting an article between the floors. A self-propelled vehicle is used for transporting an article between floors. The self-propelled vehicle and the article are loaded on a step of the escalator. The vehicle and the article are held on the step from above the article by means of a holding section. The holding section assists loading of the vehicle onto the escalator through the article in the vicinity of an entrance gate of the escalator and assists unloading of the vehicle from the escalator in the vicinity of an exit gate.

11 Claims, 1 Drawing Sheet

CLEAN ROOM HAVING AN ESCALATOR, AND METHOD OF TRANSPORTING A SEMICONDUCTOR DEVICE THEREIN

BACKGROUND OF THE INVENTION

1. Field of the Invention

The present invention relates to a clean room in which escalators are equipped between a plurality of floors of different levels, and to a method of transporting a semiconductor device in the clean room.

2. Description of the Background Art

In a clean room having floors of different levels, a vertical transport system, such as a lifter or an elevator, has heretofore been used for transporting a wafer carrier between the floors.

In connection with transportation of the wafer carrier between floors by use of the vertical transport system, the number of wafer carriers, which can be transported by a single transporting operation, is limited by the capacity of the vertical transport system.

In a case where a large number of wafer carriers are used or where the capacity of the vertical transport system is low, an operator must transport wafer carriers between floors by means of repeated use of the vertical transport system.

The vertical transport system is generally operated at a slow raising or lowering speed. Consumption of time is involved from the time the vertical transport system is called until the time the vertical transport system arrives at a position from where a call has been made.

For this reason, a long period of wait time arises in transportation of a wafer carrier between floors by use of the vertical transport system, thereby hindering efficient distribution in a clean room.

SUMMARY OF THE INVENTION

The present invention has been conceived to solve the previously-mentioned problems and a general object of the present invention is to provide a novel clean room, and is to provide a method of transporting an article such as a wafer carrier or a semiconductor device.

A more specific object of the present invention is to reduce a period of wait time required for inter-floor transportation and to achieve an efficient distribution.

According to one aspect of the present invention, in a clean room having a plurality of floors of different levels, an escalator is disposed between the plurality of floors for transporting an article between the floors.

In the clean room, since the article is transported between the floors through use of the escalator, a period of wait time to transport of the article can be shortened.

According to another aspect of the present invention, in the clean room, an article is transported between the floors through use of the escalator.

In the transporting method of the semiconductor device, an efficient distribution can be achieved.

Other objects and further features of the present invention will be apparent from the following detailed description when read in conjunction with the accompanying drawings.

DETAILED DESCRIPTION OF THE PREFERRED EMBODIMENTS

Figure 1A:
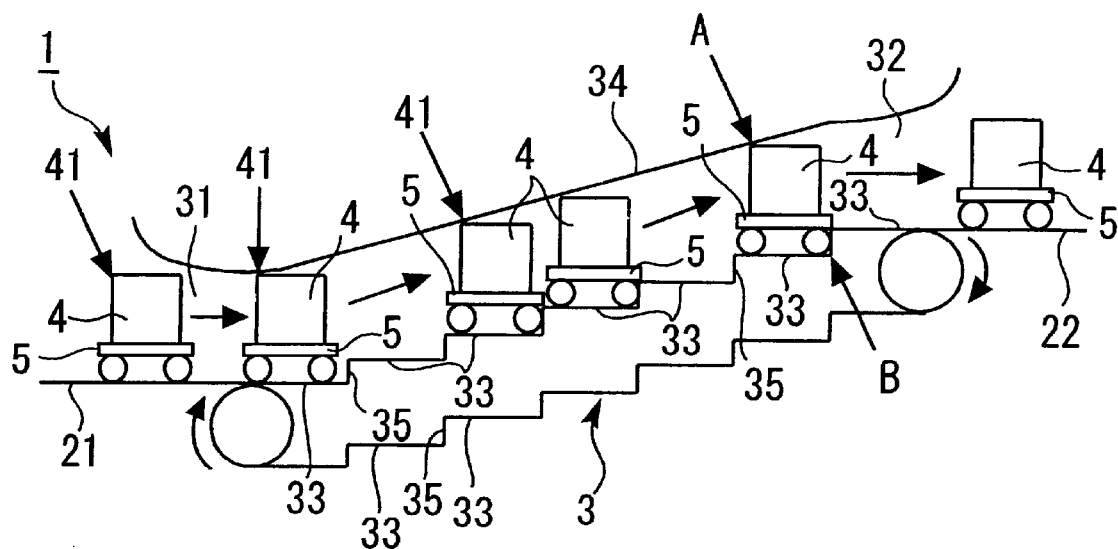
FIGS. 1A and 1B are cross-sectional views for describing a clean room, according to the present invention.

In the following, principles and embodiments of the present invention will be described with reference to the accompanying drawings. The members that are common to some of the drawings are given the same reference numerals and redundant descriptions therefore may be omitted.

Figure 1B:
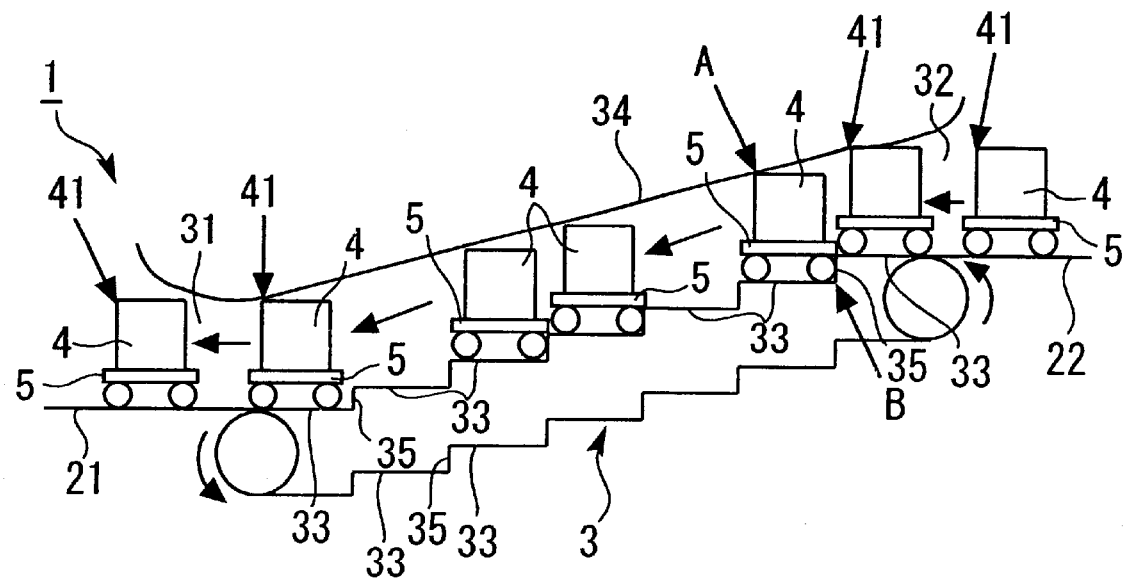

FIGS. 1A and 1B are cross-sectional views for describing a clean room, according to the present invention.

FIG. 1A shows a clean room equipped with an UP escalator, and FIG. 1B shows a clean room equipped with a DOWN escalator.

The structure of a clean room will now be described by reference to FIGS. 1A and 1B.

The escalators shown in FIGS. 1A and 1B are actuated in opposite directions and are of the same mechanism. Since the clean rooms shown in FIGS. 1A and 1B are identical in structure, an explanation of the structure of the clean room will be given by reference to FIG. 1A as follows.

As shown in FIG. 1A, a clean room 1 comprises a plurality of floors 21 and 22 having different levels, and an escalator 3 disposed between the floors 21 and 22.

The clean room 1 has a self-propelled transport vehicle (hereinafter called "vehicle") 5 for transporting a wafer carrier or a semiconductor device serving as an article 4 to each floor through use of the escalator 3.

The escalator 3 comprises an entrance gate 31 located on a first floor 21, an exit gate 32 located on a second floor 22, and a plurality of steps 33 for loading the vehicle 5.

The escalator 3 has a holding section 34 which serves as a stopper for holding the article 4 from above the article 4 loaded on the vehicle 5.

Although not shown, a sensor for sensing the vehicle 5 is located in the vicinity of each of the entrance gate 31 and the exit gate 32 of the escalator 3.

Although not shown, a control section is located in the escalator 3. In a case where the sensors do not detect the vehicle 5 for a predetermined period of time, the control section suspends operation of the escalator 3.

If the sensor detects the vehicle 5 after the escalator 3 has been stopped under control of the control section, the control section resumes operation of the escalator 3.

The operating direction of the escalator 3; i.e., the direction in which the steps 33 are actuated, can be reversed. In this case, the operator intentionally switches the operating direction of the escalator 3 in accordance with the amount of articles 4 to be transported, or the control section may automatically switch the operating direction of the escalator 3 as a result of becoming aware of the moving direction of the vehicle 5 in the sensor.

The holding section 34 is embodied by, for example, a looped sheet mounted on the ceiling of the clean room 3 such that the surface of the holding section 34 (hereinafter called "holding surface") is parallel with the inclination of the escalator 3. The looped sheet moves in the same direction and at the same speed as the steps 33.

The holding surface comes into contact with an upper end 41 of the article 4 loaded on the vehicle 5, which is loaded and remained stationary on the corresponding step 33, thereby holding the vehicle 5 and the article 4 on the step 33.

As shown in FIG. 1A, the vehicle 5 and the article 4 remaining on the step 33 are held by the holding section 34 (designated by arrow A), and a riser 35 of the step 33 (designated by arrow B) in two directions.

The holding surface may be spaced apart from the upper end 41 of the article 4. If the distance between the holding surface and the upper end 41 is less than 30 mm, the vehicle 5 and the article 4 are held on the step 33. The distance can be changed in accordance with the shape or size of the article 4, as required.

For example, a rubber sheet is used as the looped sheet. A plastic sheet or a dust-free fabric sheet may be used as the holding section 34, so long as the upper end 41 of the article 4 is not caught in the sheet.

Alternatively, the holding section 34 may be embodied by means of arrangement of a plurality of cylindrical pipes.

In addition to serving as a stopper, the holding section 34 assists loading of the vehicle 5 onto the corresponding step 33 through the article 4 in the vicinity of the entrance gate 31, and assists unloading of the vehicle 5 from the step 33 through the article 4 in the vicinity of the exit gate 32. The holding section 34 guides the vehicle 5 with the article 4 onto the corresponding step 33 from the floor 21 without being affected by the step 33 located in the vicinity of the entrance gate 31. Similarly, the holding section 34 guides the vehicle 5 to the floor 22 without being affected by the step 33 located in the vicinity of the exit gate 32.

Thus, smooth loading and unloading of the vehicle 5 on and from the escalator 3 can be attained.

Further, although not shown, if a guide member such as a slope is provided for the holding section 34 at areas in the vicinity of the entrance gate 31 and the exit gate 32, loading and unloading of the vehicle 5 becomes smoother.

The vehicle 5 is an unattended transport vehicle, which automatically travels while bearing the article 4. In order to prevent falling of the article 4 from the vehicle 5, the vehicle 5 is provided with a mechanism or stopper (both omitted from the drawings) for fittingly holding the article 4.

Next, a method of transporting an article in the foregoing clean room will be described.

With reference to FIG. 1A, a method of transporting an article from the first floor 21 to the second floor 22 will be described.

As shown in FIG. 1A, when the vehicle 5 bearing the article 4 approaches the entrance gate 31 situated on the first floor 21, the sensor (not shown) detects the vehicle 5. At this time, in a case where the escalator 3 remains inoperative, the control section (not shown) resumes operation (UP operation) of the escalator 3. Here, the article 4 is, for example, a wafer carrier (carrier box) or a semiconductor device.

Next, in the vicinity of the entrance gate 31, the holding section 34 guides the vehicle 5 onto the corresponding step 33. Subsequently, the vehicle 5 loaded on the step 33 and the article 4 loaded thereon are held by the holding section 34 from above the article 4.

Since the holding section 34 moves in the same direction (i.e., the UP direction) and at the same speed as the step 33. The article 4 and the vehicle 5 are held on the corresponding step 33 until the step 33 approaches the exit gate 32 situated on the second floor 22.

Next, the riser 35 corresponding to the step 33 disappears in the vicinity of the exit gate 32, and the holding section 34 guides the vehicle 5 from the step 33 to the second floor 22.

Next, on the second floor 22, the vehicle 5 transfers the article 4 to a carrier apparatus (not shown), which is provided on the second floor 22 and performs an ordinary carrier operation.

Thus, an inter-floor carrier operation is completed. Here, the carrying apparatus corresponds to an overhead track system; for example an OHS (overhead shuttle), or to an unattended transfer vehicle; for example an AGV (automatic guided vehicle).

Next, with reference to FIG. 1B, a method of transporting an article from the second floor 22 to the first floor 21 will now be described.

As shown in FIG. 1B, when the vehicle 5 bearing the article 4 approaches the entrance gate 32 situated on the second floor 22, the sensor (not shown) detects the vehicle 5. At this time, in a case where the escalator 3 remains inoperative, the control section (not shown) resumes operation (DOWN operation) of the escalator 3.

Next, in the vicinity of the entrance gate 32, the holding section 34 guides the vehicle 5 onto the corresponding step 33. Subsequently, the vehicle 5 loaded on the step 33 and the article 4 loaded thereon are held by the holding section 34 from above the article 4.

Since the holding section 34 moves in the same direction (i.e., the DOWN direction) and at the same speed as the step 33. The article 4 and the vehicle 5 are held on the corresponding step 33 until the step 33 approaches the exit gate 31 situated on the first floor 21.

Next, the riser 35 corresponding to the step 33 disappears in the vicinity of the exit gate 31, and the holding section 34 guides the vehicle 5 from the step 33 to the first floor 21.

Next, on the first floor 21, the vehicle 5 transfers the article 4 to another transport system (not shown), which is provided on the first floor 21 and performs an ordinary transport operation.

Thus an inter-floor transport operation is completed.

As described above, in the clean room according to the present embodiment, the escalator 3 for transporting the article 4 is disposed between the plurality of floors 21 and 22 of different levels.

A wafer carrier serving as the article 4 can be transported between floors in real time. Since inter-floor transport according to the present embodiment is superior in terms of transport efficiency, the present embodiment can be applied to a case where a large amount of articles 4 are to be transported.

Accordingly, in contrast with an inter-floor transport operation using a conventional lifter or an elevator, the inter-floor transport operation of the present embodiment enables shortening of the time to await transport of the article 4. Thus, efficient distribution can be achieved in the clean room 1.

Inter-floor transport can be automated by means of application of the vehicle 5 to the inter-floor transport operation performed by the escalator 3, thereby shortening a period of wait time.

During the course of transport of the vehicle 5 and the article 4, the holding section 34, which is provided in the escalator 3 as a stopper, holds the vehicle 5 and the article 4 on the step 33 reliably. Accordingly, the reliability of transport of the article 4 performed by the escalator 3 is improved.

The holding section 34 is simpler in mechanism than a stopper which projects from and retracts into the upper surface of a step. Moreover, there can be prevented occurrence of a failure, such as a stopper failing to project from the upper surface of a step.

Since the holding section 34 holds the vehicle 5 and the article 4 from above the article 4, the holding section 34 can hold the article 4 more reliably than the stopper which projects from and retracts into the upper surface of the step.

The holding section 34 has the function of guiding the vehicle 5 in the vicinity of the entrance gate 31 provided at the floor 21 and the exit gate 32 provided at the floor 22, as well as the function of serving as a stopper during the course of a transport operation. As a result, there are performed smooth loading and unloading of the vehicle 5 onto and off the escalator 3.

The moving direction of the escalator 3 (steps 33) used for inter-floor transport can be reversed. As a result, a single escalator can be used for UP and DOWN purposes, thus reducing costs of facilities.

The escalator 3 is provided with the sensor for sensing the vehicle 5. Further, the escalator 3 is provided with the control section. In a case where the sensors do not detect the vehicle 5 for a predetermined period of time, the control section stops the escalator 3. As a result, wasteful power dissipation can be reduced.

The clean room 1 according to the present embodiment has two floors 21 and 22 of different levels, and the escalator 3 is disposed between the two floors 21 and 22. However, a plurality of escalators may be disposed among three or more floors of different levels.

In the present embodiment, after inter-floor transport of the article 4 by use of the escalator 3 has been completed, the article 4 is transferred to the carrying apparatus from the vehicle 5. The carrying apparatus then performs an ordinary carrier operation on each of the floors 21 and 22. However, the vehicle 5 may perform an ordinary carrier operation on each of the floors 21 and 22 without use of the carrying apparatus.

This invention, when practiced illustratively in the manner described above, provides the following major effects:

According to a first aspect of the present invention, the article is transported between the floors through use of an escalator. Therefore, a period of wait time to transport of the article can be shorten as compared with that required in the case of a conventional elevator or a lifter.

In a preferred variation of the present invention, since inter-floor transport can be automated by means of an unattended vehicle, the period of wait time can be more shortened.

In a preferred variation of the present invention, the reliability of transport of the article performed by an escalator is improved.

In a preferred variation of the present invention, since the self-propelled transport vehicle and the article can be held on the step reliably. Therefore, the reliability of transport of an article through use of the escalator is improved.

In a preferred variation of the present invention, the smooth loading and unloading of the self-propelled transport vehicle can be achieved.

In a preferred variation of the present invention, a single escalator can be used for both UP and DOWN purposes. Therefore, costs of facilities can be reduced.

In a preferred variation of the present invention, wasteful power consumption can be reduced.

In a preferred variation of the present invention, a period of time required for waiting for a wafer carrier can be shortened.

In a preferred variation of the present invention, a period of time required for transporting a semiconductor device between floors can be shortened.

Further, the present invention is not limited to these embodiments, but variations and modifications may be made without departing from the scope of the present invention.

The entire disclosure of Japanese Patent Application No. 2000-219433 filed on Jul. 19, 2000 containing specification, claims, drawings and summary are incorporated herein by reference in its entirety.

What is claimed is:

1. A clean room comprising:

a plurality of floors of different levels; and an escalator which is disposed between said plurality of floors and which transports an article between said floors.

2. The clean room according to claim 1, further comprising:

a self-propelled transport vehicle for transporting to a second floor said article which is loaded on the vehicle in a first floor, through use of said escalator.

3. The clean room according to claim 2, wherein said escalator comprises an entrance gate to be disposed at one floor, an exit to be disposed at another floor, a plurality of steps on which said self-propelled transport vehicle is to be loaded, and a holding section for holding said article on said self-propelled transport vehicle from above said article.

4. The clean room according to claim 3, wherein said holding section is a looped sheet comprises a holding surface which holds an upper end of said article, said holding surface being parallel with the inclination of said escalator, and said holding surface moving in the same direction and at the same speed as said steps.

5. The clean room according to claim 4, wherein a distance between said holding surface and the upper end of said article to be held by said holding surface is 30 mm or less.

6. The clean room according to claim 4, wherein said holding section assists loading and unloading of said self-propelled transport vehicle through said article in the vicinity of said entrance or exit gate, respectively.

7. The clean room according to claim 3, wherein the moving direction of said steps of said escalator can be reversed.

8. The clean room according to claim 3, wherein said escalator further comprises sensors which are located in the vicinity of said entrance gate and said exit gate for detecting said self-propelled transport vehicle.

9. The clean room according to claim 8, further comprising a control section which stops said escalator when said sensors do not detect the self-propelled transport vehicle for a given period of time.

10. The clean room according to claim 1, wherein said article is a wafer carrier.

11. A method of transporting an article in a clean room, the clean room comprising:

a plurality of floors of different levels; and an escalator which is disposed between the plurality of floors and which transports the article between the floors, the method comprising transporting the article between the floors through use of the escalator, the article being a semiconductor device.

* * * * *